(12) United States Patent
Chu et al.

(10) Patent No.: US 8,431,235 B2
(45) Date of Patent: Apr. 30, 2013

(54) CO-EXTRUDED, MULTILAYERED POLYOLEFIN-BASED BACKSHEET FOR ELECTRONIC DEVICE MODULES

(75) Inventors: Lih-Long Chu, Midland, MI (US); John Naumovitz, Midland, MI (US); Nichole E. Nickel, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 711 days.

(21) Appl. No.: 12/612,169

(22) Filed: Nov. 4, 2009

(65) Prior Publication Data

US 2010/0108128 A1    May 6, 2010

Related U.S. Application Data

(60) Provisional application No. 61/112,011, filed on Nov. 6, 2008.

(51) Int. Cl.
- *B32B 27/00* (2006.01)
- *B32B 27/08* (2006.01)
- *B32B 27/30* (2006.01)
- *C09K 19/00* (2006.01)

(52) U.S. Cl.
USPC ............ 428/515; 428/1.1; 428/500; 428/520; 428/522; 136/252

(58) Field of Classification Search ................. None
See application file for complete search history.

(56) References Cited

U.S. PATENT DOCUMENTS

| | | |
|---|---|---|
| 3,236,917 A | 2/1966 | Giulio et al. |
| 4,950,541 A | 8/1990 | Tabor et al. |
| 4,980,210 A * | 12/1990 | Heyes .......................... 428/35.9 |
| 5,194,509 A | 3/1993 | Hasenbein et al. |
| 5,272,236 A | 12/1993 | Lai et al. |
| 5,278,272 A | 1/1994 | Lai et al. |
| 5,741,370 A | 4/1998 | Hanoka |
| 5,783,638 A | 7/1998 | Lai et al. |
| 5,986,028 A | 11/1999 | Lai et al. |
| 6,586,271 B2 | 7/2003 | Hanoka |
| 7,355,089 B2 | 4/2008 | Chang et al. |
| 2001/0045229 A1 | 11/2001 | Komori et al. |
| 2006/0199006 A1 | 9/2006 | Poon et al. |
| 2006/0199030 A1 | 9/2006 | Liang et al. |
| 2006/0199744 A1 | 9/2006 | Walton et al. |
| 2006/0199872 A1 | 9/2006 | Preito et al. |
| 2006/0199884 A1 | 9/2006 | Hoenig et al. |
| 2006/0199887 A1 | 9/2006 | Liang et al. |
| 2006/0199896 A1 | 9/2006 | Walton et al. |
| 2006/0199897 A1 | 9/2006 | Karjala et al. |
| 2006/0199905 A1 | 9/2006 | Hughes et al. |
| 2006/0199906 A1 | 9/2006 | Walton et al. |
| 2006/0199908 A1 | 9/2006 | Cheung et al. |
| 2006/0199910 A1 | 9/2006 | Walton et al. |
| 2006/0199911 A1 | 9/2006 | Markovich et al. |
| 2006/0199912 A1 | 9/2006 | Fuchs et al. |
| 2006/0199914 A1 | 9/2006 | Harris et al. |
| 2006/0199930 A1 | 9/2006 | Li Pi Shan et al. |
| 2006/0199931 A1 | 9/2006 | Poon et al. |
| 2006/0199983 A1 | 9/2006 | Kammerhofer et al. |

FOREIGN PATENT DOCUMENTS

| | | |
|---|---|---|
| WO | 9904971 | 2/1999 |
| WO | 9905206 | 2/1999 |
| WO | 0192007 | 12/2001 |
| WO | 2005090427 | 9/2005 |

\* cited by examiner

*Primary Examiner* — Sheeba Ahmed
(74) *Attorney, Agent, or Firm* — Whyte Hirschboeck Dudek SC

(57) ABSTRACT

Multilayer structures useful as a backsheet for an electronic device, e.g., a photovoltaic cell, comprise (A) a top layer comprising a polyolefin resin, e.g., ethylene vinyl acetate, and having a top facial surface and a bottom facial surface, (B) a tie layer comprising an adhesive, e.g., an ethylene glycidyl methacrylate, having a top facial surface and a bottom facial surface, the top facial surface in adhering contact with the bottom facial surface of the top layer, and (C) a bottom layer comprising a polyolefin having at least one melting peak greater than 125° C., e.g., a polypropylene, and having a top facial layer and a bottom facial surface, the top facial surface in adhering contact with the bottom facial surface of the tie layer.

7 Claims, 3 Drawing Sheets

CO-EXTRUDED, MULTILAYERED POLYOLEFIN-BASED BACKSHEET FOR ELECTRONIC DEVICE MODULES

CROSS-REFERENCE TO RELATED APPLICATIONS

The present application claims priority to U.S. patent application Ser. 61/112,011, filed on Nov. 6, 2008, the entire content of which is incorporated by reference herein.

FIELD OF THE INVENTION

This invention relates to electronic device (ED) modules, e.g., photovoltaic (PV) modules. In one aspect, the invention relates to the backsheets of such modules while in another aspect, the invention relates to such backsheets comprising a co-extruded, multilayered polyolefin. In still another aspect, the invention relates to methods of making the backsheet and the ED module incorporating such a backsheet.

BACKGROUND OF THE INVENTION

Polymeric materials are commonly used in the manufacture of modules comprising one or more electronic devices including, but not limited to, solar cells (also known as photovoltaic (PV) cells), liquid crystal panels, electro-luminescent devices and plasma display units. The modules often comprise an electronic device in combination with one or more substrates, often positioned between two substrates, in which one or both of the substrates comprise glass, metal, plastic, rubber or another material. The polymeric materials are typically used as the encapsulant or sealant for the device or depending upon the design of the device, as a skin layer component of the module, e.g., a backsheet (also known as a backskin) to a solar cell. Typical polymeric materials for these purposes include silicone resins, epoxy resins, polyvinyl butyral resins, cellulose acetate, ethylene-vinyl acetate copolymer (EVA) and ionomers.

PV modules are well known in the art, and typically comprise a stiff or flexible transparent cover layer, a front transparent encapsulant, a solar cell, a rear encapsulant (typically of the same composition as the front encapsulant) and a backsheet. The purpose of the backsheet is to protect the back surface of the cell. Current backsheet products are manufactured by lamination. Occasionally an additional processing step, e.g., coating, is included to provide adhesion between layers. The common material of construction for backsheets is polyvinyl fluoride (PVF) which is expensive and adds to the production cost of the modules.

BRIEF SUMMARY OF THE INVENTION

In one embodiment the invention is a multilayer structure each layer of which having opposing facial surfaces, the structure comprising (A) a first or top layer comprising a polyolefin resin and having a first or top facial surface and a second or bottom facial surface, (B) a second or tie layer having a first or top facial surface and a second or bottom facial surface, the top facial surface in adhering contact with the bottom facial surface of the top layer, and (C) a third or bottom layer comprising a polyolefin having at least one melting peak on a differential scanning calorimetry (DSC) curve of greater than 125° C. and having a first or top facial layer and a second or bottom facial surface, the top facial surface in adhering contact with the bottom facial surface of the tie layer. The structure may comprise optional additional layers such as a second tie layer positioned either above or below and in adhering contact with the first tie layer, i.e., the tie layer of (B) above. The structure is particularly useful as a backsheet for an electronic device (ED) module. In one embodiment the multilayer structure has a thickness of 2-22 mils.

In one embodiment the first or (A) layer comprises a maleic anhydride modified (MAH-m) polyolefin (MAH-m-polyolefin) or a blend of a polyolefin and a MAH-m-polyolefin. In the context of this invention, "polyolefin" does not include "MAH-m-polyolefin" and thus the two are mutually exclusive of one another. Also in the context of this invention, MAH-m-polyolefin includes both MAH graft-modified polyolefins (MAH-g-polyolefin) and polymers comprising units derived from both a polyolefin and maleic anhydride. In one embodiment the polyolefin is a polyethylene and the MAH-m-polyolefin is a MAH-m-polyethylene. In one embodiment the polyolefin is EVA and the MAH-m-polyolefin is MAH-m-EVA. In one embodiment the polyolefin is a blend of EVA and polyethylene, and the MAH-m-polyolefin is a blend of MAH-m-polyethylene and MAH-m-EVA. In one embodiment the first or (A) layer has a thickness of 1 to 5 mils.

In one embodiment the first or top layer comprises two sublayers, each sublayer having opposing facial surfaces, the top sublayer comprising a polyolefin or a MAH-m-polyolefin, and a second or bottom sublayer comprising a MAH-m-polyolefin or a blend of a polyolefin and a MAH-m-polyolefin, the first or top facial surface of the bottom sublayer in adhering contact with the second or bottom surface of the top sublayer, with the proviso that the top and bottom sublayers are not the same. In one embodiment the polyolefin is EVA and the MAH-m-polyolefin is MAH-m-EVA.

In one embodiment the first or top layer comprises top and bottom sublayers, each sublayer having opposing, i.e., top and bottom, facial surfaces, one sublayer comprising a polyester, e.g., a polyethylene terephthalate, or a polyamide, e.g., a nylon, and the other sublayer comprising a MAH-m-polyolefin or a blend of a polyolefin and a MAH-m-polyolefin, the top facial surface of the bottom sublayer in adhering contact with the bottom surface of the top sublayer. In one embodiment one sublayer consists or consists essentially of a polyester or polyamide. The presence of the polyester or polyamide sublayer may improve the tensile properties of the multilayer structure relative to a structure alike in all aspects except that the sublayer comprising the polyester or polyamide is replaced with a sublayer consisting of a polyolefin or a MAH-m-polyolefin.

In one embodiment the second or tie layer comprises an adhesive. In one embodiment the adhesive comprises an amine-functionalized polyolefin or an interpolymer of ethylene and a glycidyl ester of an α,β-unsaturated carboxylic acid and, optionally, a third comonomer. The glycidyl esters of an α,β-unsaturated carboxylic acid include glycidyl acrylate, methacrylate, and ethacrylate. Examples include an ethylene glycidyl methacrylate (E-GMA) and an ethylene methyl acrylate glycidyl methacrylate (E-MA-GMA). In one embodiment the second or tie layer has a thickness in a range of 0.05 to 2 mils.

In one embodiment the optional second tie layer comprises an adhesive different than the adhesive of the first tie layer, and the adhesive comprises an amine-functionalized polyolefin or an interpolymer of ethylene and a glycidyl ester of an α,β-unsaturated carboxylic acid and, optionally, a third comonomer. The glycidyl esters of α,β-unsaturated carboxylic acid include glycidyl acrylate, methacrylate, and ethacrylate. The optional second tie layer also has a thickness of 0.05 to 2 mils with the proviso that the thickness of the combined first and second tie layers (and any additional tie layers in the multilayer structure, whether or not in adhering contact with the first and/or second tie layer) is in a range of 0.05 to 2 mils.

In one embodiment the third or (C) layer comprises a polyolefin having at least one melting peak on a DSC curve of greater than 125° C., or a MAH-m-polyolefin having at least one melting peak on a DSC curve of greater than 125° C., or a blend of a polyolefin and a MAH-m-polyolefin, the blend having at least one melting peak on a DSC curve of greater than 125° C. In one embodiment the polyolefin having at least one melting peak on a DSC curve of greater than 125° C. is a polypropylene resin and the MAH-m-polyolefin having at least one melting peak on a DSC curve of greater than 125° C. is a MAH-m-propylene-based resin, especially a MAH-m-polypropylene resin. In the context of this invention, "polypropylene" does not include "MAH-m-polypropylene" and thus the two are mutually exclusive of one another. In one embodiment the third or (C) layer has a thickness of 1 to 15 mils.

In one embodiment the third or bottom layer comprises two sublayers, each sublayer having opposing facial surfaces and each sublayer compositionally different from the other. The top sublayer comprises a MAH-m-polyolefin having a melting point greater than 125° C. or a blend of a polyolefin and a MAH-m-polyolefin, the blend having at least one melting peak on a DSC curve of greater than 125° C. The second or bottom sublayer comprises a polyolefin having at least one melting peak on a DSC curve of greater than 125° C. The first or top facial surface of the first sublayer is in adhering contact with the second or bottom surface of the tie layer. The second or bottom facial surface of the first sublayer in adhering contact with the first or top facial surface of the second or bottom sublayer. In one embodiment the polyolefin having at least one melting peak on a DSC curve of greater than 125° C. is a polypropylene resin and the MAH-m-polyolefin having at least one melting peak on a DSC curve of greater than 125° C. is a MAH-m-polypropylene resin.

In one embodiment at least one of layers comprises an additive. In one embodiment the additive is at least one of a ultraviolet (UV) light stabilizer or absorber, an antioxidant and a pigment.

In one embodiment the multilayer structure is made by a single-step co-extrusion process. In one embodiment the co-extrusion process is at least one of either cast film extrusion or blown film extrusion.

In one embodiment the invention is an (ED) module, preferably a PV module, comprising a multilayer backsheet, each layer having opposing facial surfaces, the backsheet comprising (A) a first or top layer comprising a polyolefin, the first facial or top surface of this layer in adhering contact with an encapsulant or the back surface of an ED, particularly the back surface of a solar cell, (B) a second or tie layer having a first or top facial surface and a second or bottom facial surface, the top facial surface in adhering contact with the second or bottom surface of the top layer, and (C) a third or bottom layer comprising a polyolefin that has at least one melting peak on a DSC curve of greater than 125° C., the first or top facial surface of the third layer in adhering contact with the second or bottom facial surface of the second layer. The module may comprise optional additional layers such as a second tie layer positioned either above or below and in adhering contact with the first tie layer, i.e., the tie layer of (B) above.

In one embodiment the first or (A) layer of the module comprises a MAH-m-polyolefin or a blend of a polyolefin and a MAH-m-polyolefin. In one embodiment the polyolefin is a polyethylene and the MAH-m-polyolefin is a MAH-m-polyethylene. In one embodiment the polyolefin is EVA and the MAH-m-polyolefin is MAH-m-EVA. In one embodiment the polyolefin is a blend of EVA and polyethylene, and the MAH-m-polyolefin is a blend of MAH-m-polyethylene and MAH-m-EVA. In one embodiment the first or (A) layer of the module has a thickness of 1 to 5 mils.

In one embodiment the first or top layer of the module comprises two sublayers, each sublayer having opposing facial surfaces, the top sublayer comprising a polyolefin or a MAH-m-polyolefin, and a second or bottom sublayer comprising a MAH-m-polyolefin or a blend of a polyolefin and a MAH-m-polyolefin, the first or top facial surface of the bottom sublayer in adhering contact with the second or bottom surface of the top sublayer, with the proviso that the top and bottom sublayers are compositionally not the same. In one embodiment the polyolefin is EVA and the MAH-m-polyolefin is MAH-m-EVA.

In one embodiment the second or tie layer of the module comprises an adhesive. In one embodiment the adhesive comprises an amine-functionalized polyolefin or an interpolymer of ethylene and a glycidyl ester of an $\alpha,\beta$-unsaturated carboxylic acid and, optionally, a third comonomer. The glycidyl esters of an $\alpha,\beta$-unsaturated carboxylic acids include glycidyl acrylate, methacrylate, and ethacrylate. In one embodiment the second or tie layer of the module has a thickness in a range of 0.05 to 2 mils.

In one embodiment the optional second tie layer of the module comprises an adhesive different than the adhesive of the first tie layer, and the adhesive comprises an amine-functionalized polyolefin or an interpolymer of ethylene and a glycidyl ester of an $\alpha,\beta$-unsaturated carboxylic acid and, optionally, a third comonomer. The glycidyl esters of $\alpha,\beta$-unsaturated carboxylic acids include glycidyl acrylate, methacrylate, and ethacrylate. The optional second tie layer also has a thickness of 0.05 to 2 mils with the proviso that the thickness of the combined first and second tie layers (and any additional tie layers in the multilayer structure, whether or not in adhering contact with the first and/or second tie layer) is in a range of 0.05 to 2 mils.

In one embodiment the third or (C) layer comprises a composition having at least one melting peak on a DSC curve of greater than 125° C., preferably a polyolefin having at least one melting peak on a DSC curve of greater than 125° C., or a MAH-m-polyolefin having at least one melting peak on a DSC curve of greater than 125° C., or a blend of a polyolefin and a MAH-m-polyolefin, the blend having at least one melting peak on a DSC curve of greater than 125° C. In one embodiment the polyolefin having at least one melting peak on a DSC curve of greater than 125° C. is a propylene-based resin, preferably a polypropylene resin, and the MAH-m-polyolefin having at least one melting peak on a DSC curve of greater than 125° C. is a MAH-m-propylene-based resin, preferably a MAH-m-polypropylene resin. In one embodiment the third or (C) layer has a thickness of 1 to 15 mils.

In one embodiment the third or bottom layer of the module comprises two sublayers, each sublayer having opposing facial surfaces. The top sublayer comprises a MAH-m-polyolefin having at least one melting peak on a DSC curve of greater than 125° C. or a blend of a polyolefin and a MAH-m-polyolefin, the blend having at least one melting peak on a DSC curve of greater than 125° C. The second or bottom sublayer comprises a polyolefin having at least one melting peak on a DSC curve of greater than 125° C. The first or top facial surface of the first sublayer is in adhering contact with the second or bottom surface of the tie layer. The second or bottom facial surface of the first sublayer in adhering contact with the first or top facial surface of the second or bottom sublayer, with the proviso that the top and bottom sublayers are not compositionally the same. In one embodiment the polyolefin having at least one melting peak on a DSC curve of greater than 125° C. is a propylene-based resin, preferably a polypropylene resin and the MAH-m-polyolefin having at least one melting peak on a DSC curve of greater than 125° C. is a MAH-m-propylene-based resin, preferably a MAH-m-polypropylene resin.

In one embodiment at least one of layers of the module comprises an additive. In one embodiment the additive is at least one of a ultraviolet (UV) light stabilizer or absorber, an antioxidant and a pigment.

In one embodiment the module is made by laminating the multilayer structure over the back surface of an ED or a surface of an encapsulant in adhering contact with the back surface of an ED, preferably an ED that has a front surface protection layer.

In one embodiment the invention is an ED module comprising a multilayer backsheet, each layer having opposing facial surfaces, the backsheet without a tie layer and comprising (A) a first or top layer comprising (i) an ethylene copolymer, (ii) a MAH-m-ethylene copolymer, (iii) a propylene copolymer, (iv) a MAH-m-propylene copolymer, or (v) a blend of two or more of (i)-(iv), the first facial or top surface of this layer in adhering contact with an encapsulant or the back surface of an ED, and (B) a second or bottom layer comprising a polyolefin having at least one melting peak on a DSC curve of greater than 125° C., the first or top facial surface of the bottom layer in adhering contact with the second or bottom facial surface of the top layer. In one embodiment the polyolefin having at least one melting peak on a DSC curve of greater than 125° C. is a propylene-based resin, preferably a polypropylene resin.

In one embodiment of the multilayer backsheet without a tie layer, the top layer comprises two sublayers, each sublayer having opposing facial surfaces, the first or top sublayer comprising (i) an ethylene copolymer, (ii) a MAH-m-ethylene copolymer, (iii) a propylene copolymer, (iv) a MAH-m-propylene copolymer, or (v) a blend of two or more of (i)-(iv), the first or top facial surface of which is in adhering contact with an encapsulant or the back surface of an ED, and a second or bottom sublayer comprising an ethylene copolymer or a MAH-m-ethylene copolymer, with the proviso that the top and bottom sublayers are not compositionally the same, the first or top facial surface of which is in adhering contact with the second or bottom surface of the top sublayer.

In one embodiment the invention is a process for making an ED module, preferably a PV module, the process comprising the step of (A) co-extruding a multilayer backsheet comprising (a) a first or top layer comprising a MAH-m-polyolefin, e.g., MAH-m-EVA, or a blend of a polyolefin and a MAH-m-polyolefin, e.g., polyethylene and a MAH-m-EVA, (b) a second or tie layer comprising an adhesive, e.g., E-GMA, and (c) a third or bottom layer comprising a blend of a polyolefin and a MAH-m-polyolefin, the blend having at least one melting peak on a DSC curve of greater than 125° C., e.g., PP and MAH-m-PP, (B) laminating the multilayer backsheet to the back surface of an ED or a surface of an encapsulant in adhering contact with the back surface of an ED, preferably an ED that has a front surface protection layer.

In one embodiment the invention is a process for making an ED module, preferably a PV module, the process comprising the steps of (A) co-extruding a multilayer backsheet that does not contain a tie layer comprising (a) a first or top layer comprising EVA, MAH-m-EVA, a blend of EVA and polyethylene, or a blend of MAH-m-EVA and polyethylene, and (b) a second or bottom layer comprising a polyolefin having at least one melting peak on a DSC curve of greater than 125° C., e.g., PP, and (B) laminating the multilayer backsheet to the back surface of an ED or a surface of an encapsulant in adhering contact with the back surface of an ED, preferably an ED that has a front surface protection layer.

In one embodiment in which a multilayer backsheet does not contain a tie layer, the first or top layer comprises two sublayers, i.e., (a) the first or top sublayer comprising an ethylene copolymer, a MAH-m-ethylene copolymer, or a propylene copolymer, and (b) a second or bottom sublayer comprising an ethylene copolymer or a MAH-m-ethylene copolymer.

The polyolefin of the top layer of the backsheet is different than the polyolefin of the bottom layer of the backsheet, but both polyolefins can have at least one melting peak on a DSC curve of greater than 125° C. Typically, however, the highest melting peak of the polyolefin of the top layer is less than 125, more typically less than 115 and even more typically less than 105, ° C.

DETAILED DESCRIPTION OF THE PREFERRED EMBODIMENT

Figure 1:
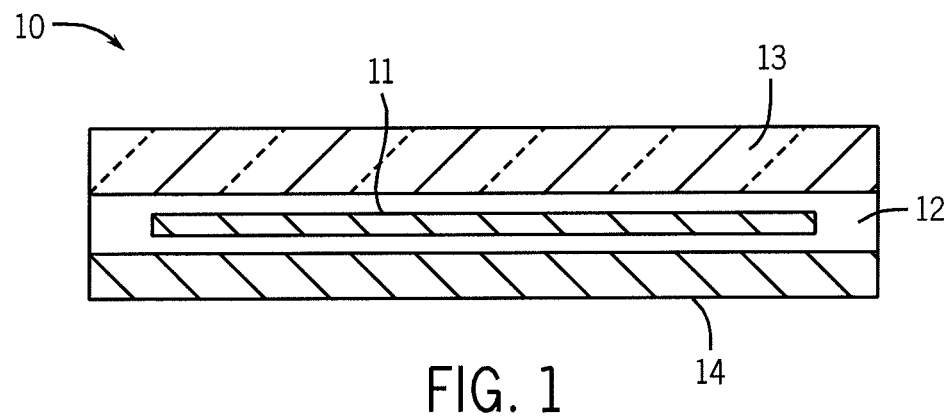
FIG. 1 is cross-sectional view of an exemplary rigid PV module.

Unless stated to the contrary, implicit from the context, or customary in the art, all parts and percents are based on weight and all test methods are current as of the filing date of this disclosure. For purposes of United States patent practice, the contents of any referenced patent, patent application or publication are incorporated by reference in their entirety (or its equivalent US version is so incorporated by reference) especially with respect to the disclosure of synthetic techniques, definitions (to the extent not inconsistent with any definitions specifically provided in this disclosure), and general knowledge in the art.

The numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property or process parameter, such as, for example, molecular weight, viscosity, melt index, temperature, etc., is from 100 to 1,000, it is intended that all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges are provided within this disclosure for, among other things, density, melt index and relative amounts of components in various compositions and blends.

The term "comprising" and its derivatives are not intended to exclude the presence of any additional component, step or procedure, whether or not the same is specifically disclosed. In order to avoid any doubt, any process or composition claimed through use of the term "comprising" may include any additional steps, equipment, additive, adjuvant, or compound whether polymeric or otherwise, unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or", unless stated otherwise, refers to the listed members individually as well as in any combination.

"Composition" and like terms mean a mixture of two or more materials. Included in compositions are pre-reaction, reaction and post-reaction mixtures the latter of which will include reaction products and by-products as well as unreacted components of the reaction mixture and decomposition products, if any, formed from the one or more components of the pre-reaction or reaction mixture.

"Blend", "polymer blend" and like terms mean a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method known in the art. Blends are not laminates, but one or more layers of a laminate may contain a blend.

"Polymer" means a compound prepared by polymerizing monomers, whether of the same or a different type. The generic term polymer thus embraces the term homopolymer, usually employed to refer to polymers prepared from only one type of monomer, and the term interpolymer as defined below. It also embraces all forms of interpolymers, e.g., random, block, etc. The terms "ethylene/α-olefin polymer" and "propylene/α-olefin polymer" are indicative of interpolymers as described below.

"Interpolymer" means a polymer prepared by the polymerization of at least two different monomers. This generic term includes copolymers, usually employed to refer to polymers prepared from two different monomers, and polymers prepared from more than two different monomers, e.g., terpolymers, tetrapolymers, etc.

"Polyolefin", "polyolefin polymer", "polyolefin resin" and like terms mean a polymer produced from a simple olefin (also called an alkene with the general formula $C_nH_{2n}$) as a monomer. Polyethylene is produced by polymerizing ethylene with or without one or more comonomers, polypropylene by polymerizing propylene with or without one or more comonomers, etc. Thus, polyolefins include interpolymers such as ethylene/α-olefin copolymers, propylene/α-olefin copolymers, etc.

"(Meth)" indicates that the methyl substituted compound is included in the term. For example, the term "ethylene-glycidyl (meth)acrylate" includes ethylene-glycidyl acrylate (E-GA) and ethylene-glycidyl methacrylate (E-GMA), individually and collectively.

"Layer" means a single thickness, coating or stratum continuously or discontinuously spread out or covering a surface.

"Multi-layer" means at least two layers.

"Facial surface", "planar surface" and like terms mean the surfaces of the layers that are in contact with the opposite and adjacent surfaces of the adjoining layers. Facial surfaces are in distinction to edge surfaces. A rectangular layer comprises two facial surfaces and four edge surfaces. A circular layer comprises two facial surfaces and one continuous edge surface.

"In adhering contact" and like terms mean that one facial surface of one layer and one facial surface of another layer are in touching and binding contact to one another such that one layer cannot be removed for the other layer without damage to the in-contact facial surfaces of both layers.

"Sealing relationship" and like terms mean that two or more components, e.g., two polymer layers, or a polymer layer and an electronic device, or a polymer layer and a glass cover sheet, etc., join with one another in such a manner, e.g., co-extrusion, lamination, coating, etc., that the interface formed by their joining is separated from their immediate external environment.

One acceptable DSC technique for measuring the melting peaks of the polyolefins and MAH-m-polyolefins used in the practice of this invention are described in U.S. Pat. No. 5,783, 638. While many blends comprising two or more polyolefins and/or MAH-m-polyolefins will have more than one melting peak, many individual polyolefins and MAH-m-polyolefins will comprise only one melting peak.

Polyolefin Resins

The following description of properties regarding the polyolefin resins useful in the practice of this invention are of the polyolefin before grafting or other modification.

The polyolefin resins useful in the bottom layer of the backsheet are typically made with multi-site catalysts, e.g., Zeigler-Natta and Phillips catalysts, and have a melting point of at least 125, preferably greater than 140, more preferably greater than 150 and even more preferably greater than 160, ° C. These polyolefin resins are preferably a polypropylene. Polyolefin resins with a melting point of at least 125° C. often exhibit desirable toughness properties useful in the protection of the electronic device of the module.

If the polyolefin resin is an interpolymer, then the comonomer is typically an α-olefin. For purposes of this invention, ethylene is an α-olefin if propylene or higher olefin is the primary monomer. The α-olefin is preferably a $C_{3-20}$ linear, branched or cyclic α-olefin. Examples of $C_{3-20}$ α-olefins include propene, 1-butene, 4-methyl-1-pentene, 1-hexene, 1-octene, 1-decene, 1-dodecene, 1-tetradecene, 1-hexadecene, and 1-octadecene. The α-olefins can also contain a cyclic structure such as cyclohexane or cyclopentane, resulting in an α-olefin such as 3-cyclohexyl-1-propene (allyl cyclohexane) and vinyl cyclohexane. Although not α-olefins in the classical sense of the term, for purposes of this invention certain cyclic olefins, such as norbornene and related olefins, are α-olefins and can be used in place of some or all of the α-olefins described above. Similarly, styrene and its related olefins (for example, α-methylstyrene, etc.) are α-olefins for purposes of this invention. Acrylic and methacrylic acid and their respective ionomers, and acrylates and methacrylates are also α-olefins for purposes of this invention. Illustrative polyolefin copolymers include but are not limited to ethylene/propylene, ethylene/butene, ethylene/1-hexene, ethylene/1-octene, ethylene/styrene, ethylene/acrylic acid (EAA), ethylene/methacrylic acid (EMA), ethylene/acrylate or methacrylate, EVA and the like. Illustrative terpolymers include ethylene/propylene/1-octene, ethylene/propylene/butene, ethylene/butene/1-octene, and ethylene/butene/styrene. The copolymers can be random or blocky.

More specific examples of olefinic interpolymers useful in this invention, particularly in the top layer of the backsheet, include very low density polyethylene (VLDPE) (e.g., FLEXOMER® ethylene/1-hexene polyethylene made by The Dow Chemical Company), homogeneously branched, linear ethylene/α-olefin copolymers (e.g. TAFMER® by Mitsui Petrochemicals Company Limited and EXACT® by Exxon Chemical Company), homogeneously branched, substantially linear ethylene/α-olefin polymers (e.g., AFFINITY® and ENGAGE® polyethylene available from The Dow Chemical Company), and ethylene multi-block copolymers (e.g., INFUSE® olefin block copolymers available from The Dow Chemical Company). The more preferred polyolefin copolymers for use in the top layer of the backsheet are the homogeneously branched linear and substantially linear ethylene copolymers, particularly the substantially linear ethylene copolymers which are more fully described in U.S. Pat. Nos. 5,272,236, 5,278,272 and 5,986,028, and the ethylene multi-block copolymers which are more fully described in U.S. Pat. No. 7,355,089, WO 2005/090427, US2006/0199931, US2006/0199930, US2006/0199914, US2006/0199912, US2006/0199911, US2006/0199910, US2006/0199908, US2006/0199906, US2006/0199905, US2006/0199897, US2006/0199896, US2006/0199887, US2006/0199884, US2006/0199872, US2006/0199744, US2006/0199030, US2006/0199006 and US2006/0199983.

The polyolefin resins useful in the practice of this invention also include propylene, butene and other alkene-based polymers, e.g., copolymers comprising a majority of units derived from propylene and a minority of units derived from another α-olefin (including ethylene). The polypropylenes with a melting point of at least 125° C. are particularly useful in the bottom layer of the backsheet. These polypropylenes include polypropylene homopolymer, copolymers of propylene and one or more other olefin monomers, a blend of two or more homopolymers or two or more copolymers, and a blend of one or more homopolymer with one or more copolymer, as long as it has a melting point of 125° C. or more. The polypropylene polymers can vary widely in form and include, for example, substantially isotactic propylene homopolymer, random propylene copolymers, and graft or block propylene copolymers.

The propylene copolymers comprise at least 85, more typically at least 87 and even more typically at least 90, mole percent units derived from propylene. The remainder of the units in the propylene copolymer is derived from units of at least one α-olefin having up to about 20, preferably up to 12 and more preferably up to 8, carbon atoms. The α-olefin is preferably a $C_{3-20}$ linear, branched or cyclic α-olefin as described above.

The following are illustrative but non-limiting propylene polymers that can be used in the backsheets of this invention: a propylene impact copolymer including but not limited to DOW Polypropylene T702-12N; a propylene homopolymer including but not limited to DOW Polypropylene HSO2-25RZ; and a propylene random copolymer including but not limited to DOW Polypropylene R751-12N. Other polypropylenes include some of the VERSIFY® polymers available from The Dow Chemical Company, the VISTAMAXX® polymers available from ExxonMobil Chemical Company, and the PRO-FAX polymers available from LyondellBasell Industries, e.g., PROFAX™ SR-256M, which is a clarified propylene copolymer resin with a density of 0.90 g/cc and a MFR of 2 g/10 min, PROFAX™ 8623, which is an impact propylene copolymer resin with a density of 0.90 g/cc and a MFR of 1.5 g/10 min. Still other propylene resins include CATALLOY™ in-reactor blends of polypropylene (homo- or copolymer) with one or more of propylene-ethylene or ethylene-propylene copolymer (all available from Basell, Elkton, Md.), Shell's KF 6100 propylene homopolymer; Solvay's KS 4005 propylene copolymer; and Solvay's KS 300 propylene terpolymer. Furthermore, INSPIRE™ D114, which is a branched impact propylene copolymer with a melt flow index of 0.5 dg/min (230° C./2.16 kg) and a melting point of 164° C., or INSPIRE™ D118.01 which is a propylene homopolymer with a melt flow rate of 8.0 dg/min (230° C./2.16 kg), can be used (both also available from The Dow Chemical Company).

Blends of polyolefin resins can also be used in any layer of the backsheet, and the polyolefin polymers can be blended or diluted with one or more other polymers to the extent that the polyolefin is (i) miscible with the other polymer, (ii) the other polymer has little, if any, deleterious impact on the desirable properties of the polyolefin polymer, e.g., optics and low modulus, and (iii) the polyolefin polymer of this invention constitutes at least about 70, preferably at least about 75 and more preferably at least about 80, weight percent of the blend.

Ethylene-Vinyl Acetate Resins

One particularly preferred polyolefin for use in the top layer of the backsheet is an EVA copolymer that will form a sealing relationship with the electronic device and/or another component of the module, e.g., encapsulant, a glass cover sheet, etc. when brought into adhesive contact with the device or other component. The ratio of units derived from ethylene to units derived from vinyl acetate in the copolymer, before grafting or other modification, can vary widely, but typically the EVA copolymer contains at least about 1, preferably at least about 2, more preferably at least about 4 and even more preferably at least about 6, wt % units derived from vinyl acetate. Typically, the EVA copolymer contains less than about 25, preferably less than about 22, more preferably less than about 18 and even more preferably less than about 15, wt % units derived from vinyl acetate. The EVA copolymer can be made by any process including emulsion, solution and high-pressure polymerization.

The EVA copolymer before grafting or other modification typically has a density of less than about 0.95, preferably less than about 0.945, more preferably less than about 0.94, g/cc. The same EVA copolymer typically has a density greater than about 0.9, preferably greater than 0.92, and more preferably greater than about 0.925, g/cc. Density is measured by the procedure of ASTM D-792. EVA copolymers are generally characterized as semi-crystalline, flexible and having good optical properties, e.g., high transmission of visible and UV-light and low haze.

Moreover, these same EVA copolymers typically have a melt index (MI as measured by the procedure of ASTM D-1238 (190C/2.16 kg) of less than 100, preferably less than 75, more preferably less than 50 and even more preferably less than 30, g/10 min. The typical minimum MI is 0.3, and more typically it is 5 g/10 min.

MAH-m-Polyolefins

MAH-m-polyolefins include MAH-g-polyolefins and MAH interpolymers, i.e., the MAH functionality is present in the polyolefin either by grafting onto the polymer backbone or incorporating the functionality into the backbone through copolymerization of MAH with the olefin monomer.

In one embodiment of the invention, the polyolefin is graft-modified to enhance the interlayer adhesion between the top layer and the bottom layer of the multilayer structure through a reaction of the grafted functionality with the reactive group present in the middle tie layer. Any material that can be grafted to the polyolefin and can react with the reactive group present in the tie layer can be used as the graft material.

Any unsaturated organic compound containing at least one ethylenic unsaturation (e.g., at least one double bond), at least one carbonyl group (—C═O), and that will graft to the polyolefin polymer and more particularly to EVA or polypropylene, can be used as the grafting material. Representative of compounds that contain at least one carbonyl group are the carboxylic acids, anhydrides, esters and their salts, both metallic and nonmetallic. Preferably, the organic compound contains ethylenic unsaturation conjugated with a carbonyl group. Representative compounds include maleic, fumaric, acrylic, methacrylic, itaconic, crotonic, a-methyl crotonic, and cinnamic acid and their anhydride, ester and salt derivatives, if any. Maleic anhydride is the preferred unsaturated organic compound containing at least one ethylenic unsaturation and at least one carbonyl group.

The unsaturated organic compound content of the graft polyolefin is at least about 0.01 wt %, and preferably at least about 0.05 wt %, based on the combined weight of the polyolefin and the organic compound. The maximum amount of unsaturated organic compound content can vary to convenience, but typically it does not exceed about 10 wt %, preferably it does not exceed about 5 wt %, and more preferably it does not exceed about 2 wt %. This unsaturated organic content of the graft polyolefin is measured by a titration method, e.g., a grafted polyolefin/xylene solution is titrated with a potassium hydroxide (KOH) solution. The MAH functionality can be present in the polyolefin e.g., by grafting, or even by copolymerization with the olefin monomer.

The unsaturated organic compound can be grafted to the polyolefin by any known technique, such as those taught in U.S. Pat. Nos. 3,236,917 and 5,194,509. For example, in the '917 patent the polymer is introduced into a two-roll mixer and mixed at a temperature of 60° C. The unsaturated organic compound is then added along with a free radical initiator, such as, for example, benzoyl peroxide, and the components are mixed at 30° C. until the grafting is completed. In the '509 patent, the procedure is similar except that the reaction temperature is higher, e.g., 210 to 300° C., and a free radical initiator is not used or is used at a reduced concentration.

An alternative and preferred method of grafting is taught in U.S. Pat. No. 4,950,541 by using a twin-screw devolatilizing extruder as the mixing apparatus. The polymer and unsaturated organic compound are mixed and reacted within the extruder at temperatures at which the reactants are molten and in the presence of a free radical initiator. Preferably, the unsaturated organic compound is injected into a zone maintained under pressure within the extruder.

Adhesive Resins

For high temperature applications, e.g., applications in which the multilayer structure will be used at a temperature of 40° C. or higher (e.g., 80° C.) such as those temperatures possibly experienced by a PV module located in a desert environment, a tie layer, while not always necessary, is often useful and desirable. For applications with a lower temperature profile, the presence of a tie layer is typically optional and determined by other factors, e.g., cost, physical toughness, etc.

Any polymeric material that comprises a reactive group or functionality and can react with the grafted functionality present in the top layer and the bottom layer of the multilayer structure can be used as an adhesive in the practice of this invention. Examples include a reaction of a glycidyl methacrylate with a maleic anhydride and a reaction of an amine with a maleic anhydride. Preferred polymeric materials include an amine-functionalized polyolefin and a copolymer of an ethylene with a glycidyl ester of an α,β-unsaturated carboxylic acid and an optional third comonomer. More preferred polymeric materials include an ethylene glycidyl methacrylate (E-GMA), an ethylene methyl acrylate glycidyl methacrylate (E-MA-GMA), and an amine-functionalized ethylene-octene random or block copolymer.

Crosslinking

Although not preferred, due to the low density and modulus of the polyolefin resins used in the practice of this invention, these polymers are typically cured or crosslinked at the time of contact or after, usually shortly after, the multilayered structure, e.g., a backsheet, or module has been constructed. Crosslinking can be effected by any one of a number of different and known methods, e.g., by the use of thermally activated initiators, e.g., peroxides and azo compounds; photoinitiators, e.g., benzophenone; radiation techniques including E-beam and x-ray; vinyl silane, e.g., vinyl tri-ethoxy or vinyl tri-methoxy silane; and moisture cure.

Additives

The individual layers of the multilayered structure can further comprise one or more additives. Exemplary additives include UV-stabilizers, UV-absorbers, and processing stabilizers such as trivalent phosphorus compounds. The UV-stabilizers and UV-absorbers are useful in, e.g., reducing the oxidative degradation and improving the weatherability of the product, and include hindered phenols such as Cyasorb UV-2908, triazines Cyasorb UV-1164 and hindered amines such as Cyasorb UV-3529, Cyasorb UV-3346, Cyasorb UV-3583 Hostavin N30, Univil 4050, Univin 5050, Chimassorb UV-119, Chimassorb 944 LD, Tinuvin 622 LD and the like. The phosphorus compounds include phosphonites (PEPQ) and phosphites (Weston 399, TNPP, Irgafos 168 and Doverphos 9228). The amount of UV-stabilizer and UV-absorber is typically from about 0.1 to 1.0%, and preferably from about 0.2 to 0.5% based on the weight of the polymeric material comprising the layer or sublayer. The amount of processing stabilizer is typically from about 0.02 to 0.5%, and preferably from about 0.05 to 0.15% based on the weight of the polymeric material comprising the layer or sublayer.

Other additives include, but are not limited to, antioxidants (e.g., hindered phenolics (e.g., Irganox® 1010 made by Ciba Specialty Chemicals.), cling additives, e.g., PIB, anti-blocks, anti-slips, pigments and fillers (clear if transparency is important to the application). In-process additives, e.g. calcium stearate, water, etc., may also be used. These and other potential additives are used in the manner and amount as is commonly known in the art.

Multilayer Structures and ED Modules

The polymeric materials of this invention are used to construct multilayer structures and electronic device modules in the same manner and using the same amounts as is known in the art, e.g., such as those taught in U.S. Pat. No. 6,586,271, US Patent Application Publication US2001/0045229 A1, WO 99/05206 and WO 99/04971. These materials can be used to construct "skins" for the electronic device, i.e., multilayered structures for application to one or both face surfaces of the device, particularly the back surface of such devices. Preferably a multilayered structure, e.g., a backsheet, is co-extruded, i.e., all layers of the multilayered structured are extruded at the same time, such that as the multilayered structure is formed, it is also directly applied onto the back surface of an electronic device, or directly onto an encapsulant that has previously been applied to the electronic device The top facial surface of the top layer of the multilayered structure exhibits good adhesion for the face surfaces of the device, particularly the back surface of the device, and/or the material that encapsulates the device.

In one embodiment in which the ED module is a rigid PV module, the module comprises (i) at least one solar cell, typically a plurality of such cells arrayed in a linear or planar pattern, (ii) at least one glass cover sheet, typically a glass cover sheet over the front facial surface of the cell, (iii) at least one polymeric encapsulant material encapsulating the cell, and (iv) a backsheet in adhering contact with the encapsulant material that covers the back surface of the cell. The encapsulant exhibits good adhesion to both the device and the glass sheet, and good transparency to the specific forms of electromagnetic radiation, e.g., sunlight, infrared, ultra-violet, etc., utilized by the cell. Good, typically excellent, transparency means transmission rates in excess of 90, preferably in excess of 95 and even more preferably in excess of 97, percent as measured by UV-vis spectroscopy (measuring absorbance in the wavelength range of about 250-1200 nanometers. An alternative measure of transparency is the internal haze method of ASTM D-1003-00. If transparency is not a requirement for operation of the electronic device, then the polymeric material can contain opaque filler and/or pigment.

The overall thickness of the multilayered structure, sans attachment to an encapsulant and/or electronic device or anything else, is typically between 2 and 22, preferably between 3 and 18 and more preferably between 5 and 15, mils. This includes any optional, additional layers that form and are an integral part of the multilayer structure. The thickness of the top layer, inclusive of any sublayer components, is typically between 1 and 5, preferably between 1.5 and 4.5 and more preferably between 2 and 4, mils. The thickness of the tie layer, inclusive of any sublayer components and any secondary layers that are within the multilayer structure whether or not in adhering facial contact with another tie layer, is typically between 0.05 and 2, preferably between 0.1 and 1.8 and more preferably between 0.3 and 1.5, mils. The thickness of the bottom layer, inclusive of any sublayer components, is typically between 1 and 15, preferably between 2 and 12 and more preferably between 3 and 10, mils.

In FIG. 1, rigid PV module 10 comprises photovoltaic cell 11 surrounded or encapsulated by transparent protective layer or encapsulant 12 comprising a polyolefin copolymer. Glass cover sheet 13 covers a front surface of the portion of the transparent encapsulant disposed over PV cell 11. Backsheet or backskin 14 covers a rear surface of the portion of transparent encapsulant 12 disposed on a rear surface of PV cell 11. Backsheet 14 need not be transparent if the surface of the PV cell to which it is opposed is not reactive to sunlight. In this embodiment, encapsulant 12 encapsulates PV cell 11. The thicknesses of these layers, both in an absolute context and relative to one another, are not critical to this invention and as such, can vary widely depending upon the overall design and purpose of the module. Typical thicknesses for encapsulant 12 are in the range of about 0.125 to about 2 millimeters (mm), and for the glass cover sheet in the range of about 0.125 to about 1.25 mm. The thickness of the electronic device can also vary widely.

Figure 2:
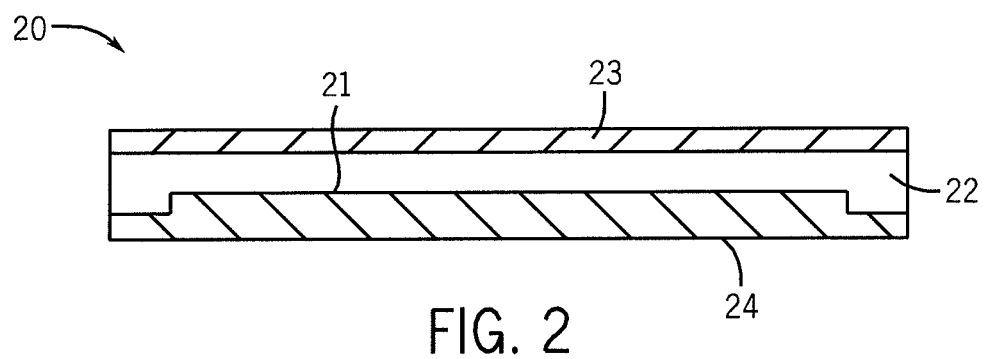
FIG. 2 is a cross-sectional view of an exemplary flexible PV module.

In FIG. 2, flexible PV module 20 comprises thin film photovoltaic 21 over-lain by transparent protective layer or encapsulant 22 comprising a polyolefin copolymer. Glazing/top layer 23 covers a front surface of the portion of the encapsulant disposed over thin film PV 21. Flexible backsheet 24 covers the bottom surface of thin film PV 21. Backsheet 24 need not be transparent if the surface of the thin film cell which it is covering is not reactive to sunlight. In this embodiment, encapsulant 22 does not encapsulate thin film PV 21. The overall thickness of a typical rigid or flexible PV cell module will typically be in the range of about 5 to about 50 mm.

Figure 3:
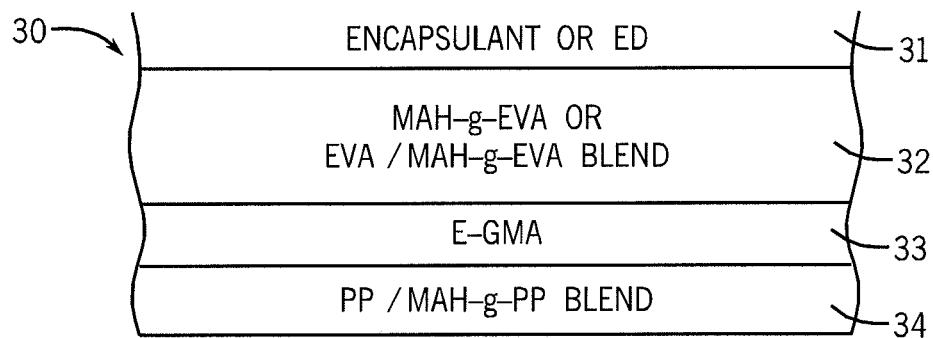
FIG. 3 is a cross-sectional view of a three-layer backsheet in adhering contact with an encapsulant or the back surface of an electronic device.

FIG. 3 is a cross-sectional view of three-layer backsheet 30 in adhering contact with either encapsulant or back surface 31 of an electronic device, e.g., a solar cell. If backsheet 30 is in adhering contact with the encapsulant, then the encapsulant is sandwiched between the backsheet and the back surface of the electronic device (this arrangement not shown). Backsheet 30 comprises top layer 32 which comprises either MAH-m-EVA or a blend of EVA and MAH-m-EVA at a weight ratio of MAH-m-EVA to EVA in the range of 99.99:0.01 to 5:95, preferably 99.99:0.01 to 20:80 and more preferably 99.99:0.01 to 30:70. The top facial surface of top layer 32 is in adhering contact with the bottom facial surface of either the encapsulant or ED, and the bottom facial surface of top layer 32 is in adhering contact with the top facial surface of tie layer 33 (comprised of E-GMA). The bottom facial surface of tie layer 33 is in adhering contact with the top facial surface of bottom layer 34 the latter of which comprises a blend of PP and MAH-m-PP at a weight ratio of PP to MAH-m-PP in the range of 95:5 to 5:95, preferably 95:5 to 30:70 and more preferably 95:5 to 50:50.

Figure 4:
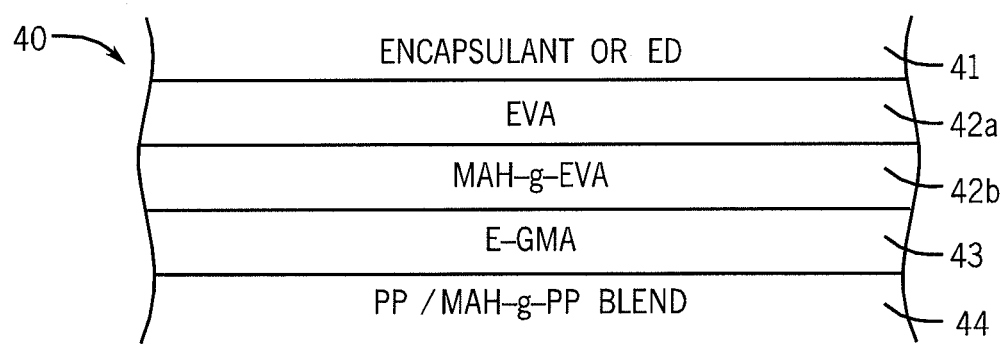
FIG. 4 is a cross-sectional view of a three-layer backsheet in adhering contact with an encapsulant or the back surface of an electronic device in which the top layer of the backsheet comprises two sublayers.

FIG. 4 is a cross-sectional view of a three-layer backsheet in adhering contact with an encapsulant or the back surface of an electronic device in which the top layer of the backsheet comprises two sublayers. The structure and composition of each layer of multilayered structure 40 is similar to that of multilayered structure 30 except that top layer 32 is restructured into sublayers 42a (comprised of EVA) and 42b (comprised of MAH-m-EVA). The top facial surface of sublayer 42a is in adhering contact with the bottom facial surface of encapsulant or ED 41 and the bottom facial surface of sublayer 42b is in adhering contact with the top facial surface of tie layer 43 (comprised of E-GMA).

Figure 5:
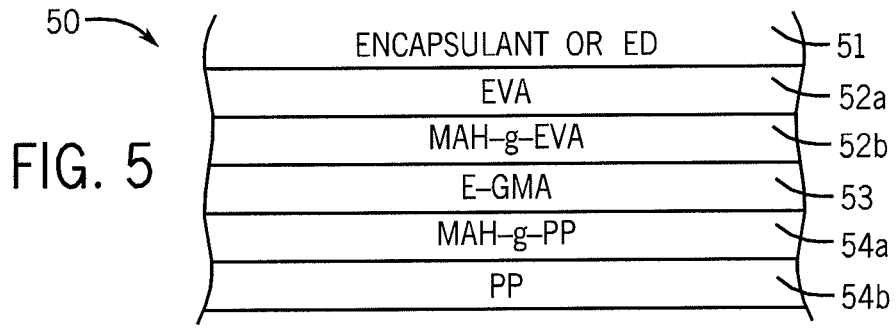
FIG. 5 is a cross-sectional view of a three-layer backsheet in adhering contact with an encapsulant or the back surface of an electronic device in which both the top and bottom layers of the backsheet comprise two sublayers.

FIG. 5 is a cross-sectional view of a three-layer backsheet in adhering contact with an encapsulant or the back surface of an electronic device in which both the top and bottom layers of the backsheet comprise two sublayers. The structure and composition of each layer of multilayered structure 50 is similar to that of multilayered structure 40 except that bottom layer 44 is restructured into sublayers 54a (comprised of MAH-m-PP) and 54b (PP). The top facial surface of sublayer 54a is in adhering contact with the bottom facial surface of tie layer 53.

Figure 6:
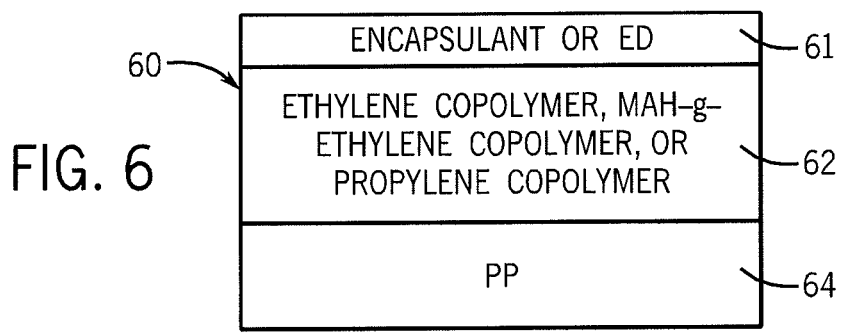
FIG. 6 is a cross-sectional view of a two-layer backsheet in adhering contact with an encapsulant or the back surface of an electronic device but without a tie layer.

FIG. 6 is a cross-sectional view of a two-layer backsheet in adhering contact with an encapsulant or the back surface of an electronic device but without a tie layer. In this illustration, multilayered structure 60 is in adhering contact with encapsulant or the back surface of electronic device 61. Top layer 62 comprises an ethylene copolymer, a MAH-m-ethylene copolymer, or a propylene copolymer, and the top facial surface of top layer 62 is in adhering contact with encapsulant or ED back surface 61 and the bottom facial surface of top layer 62 is in adhering contact with the top facial surface of bottom layer 64, e.g., PP. The blend of EVA (or MAH-m-EVA) and PE is typically at a weight ratio of EVA (or MAH-m-EVA) to PE in the range of 99.99:0.01 to 5:95, preferably 99.99:0.01 to 20:80 and more preferably 99.99:0.01 to 30:70. This two-layer backsheet construction is suitable for use in ED modules that experience relatively low temperatures, e.g., below 40° C., during use.

Figure 7:
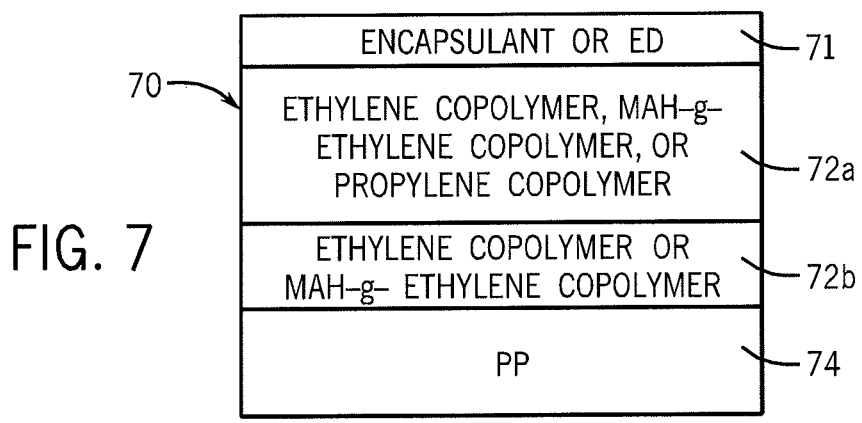
FIG. 7 is a cross-sectional view of a two-layer backsheet in adhering contact with an encapsulant or the back surface of an electronic device, but without a tie layer and in which the top layer of the backsheet comprises two sublayers.

FIG. 7 is a cross-sectional view of a two-layer backsheet in adhering contact with an encapsulant or the back surface of an electronic device, but without a tie layer and in which the top layer of the backsheet comprises two sublayers. The structure and composition of each layer of multilayered structure 70 is similar to that of multilayered structure 60 except that top layer 62 is restructured into sublayers 72a (composition like 62) and 72b (comprised of an ethylene copolymer or a MAH-m-ethylene copolymer). The top facial surface of sublayer 72a is in adhering contact with the bottom facial surface of encapsulant or ED 71.

The following examples further illustrate the invention. Unless otherwise indicated, all parts and percentages are by weight.

Specific Embodiments

Multilayer films (2 and 3 layers) are made on a pilot cast line consisting of four extruders of various sizes (1.25 to 2.5 inches), a cooling unit, and a film winder. The layered structures, processing conditions and the interlayer adhesion are summarized in the following table.

|  | Example # ||||||||
|  | Example 1 ||| Example 2 || Example 3 |||
| --- | --- | --- | --- | --- | --- | --- | --- | --- |
| Layer # | 1 | 2 | 3 | 1 | 2 | 1 | 2 | 3 |
| Layer thickness, mil | 2.0 | 1.0 | 5.0 | 2.2 | 5.8 | 2.0 | 1.0 | 5.0 |
| Layer % | 25 | 12.5 | 62.5 | 27.3 | 72.7 | 25 | 12.5 | 62.5 |
| Materials, wt % | 100 | 100 | 100 | 100 | 100 | 100 | 100 | 100 |
| EVA (92° C. Tm, 15% VA) | 40 |  |  | 40 |  |  |  |  |
| PE (1.15 MI) | 40 |  |  | 40 |  |  |  |  |
| PP (8.0 MFR@230° C.) |  |  | 82 |  | 82 |  |  | 52 |
| UV/PE concentrate | 10 |  |  | 10 |  | 10 |  |  |
| UV/PP concentrate |  |  | 10 |  | 10 |  |  | 10 |
| MAH-m-EVA (92° C. Tm) |  | 100 |  |  |  |  | 80 |  |
| White PE MB | 10 |  |  | 10 |  | 10 |  |  |
| White PP MB |  |  | 8 |  | 8 |  |  | 8 |
| E-GMA (105° C. Tm, 5 MI) |  |  |  |  |  |  | 100 |  |
| MAH-m-PP (250 MFR@230° C.) |  |  |  |  |  |  |  | 30 |
| (Processing) Extruder # | 4 | 3 | 1 | 4 | 1 | 4 | 3 | 1 |
| Extruder temp ° F. | 390 | 400 | 400 | 390 | 400 | 410 | 330 | 410 |
| Extruder RPM | 30 | 15 | 88 | 40 | 85 | 24 | 12 | 88 |
| Feedblock temp. ° F. |  | 400 |  | 400 ||| 400 ||
| Die temp. ° F. |  | 390 |  | 390 ||| 390 ||
| Cast roll speed ft/min |  | 15 |  | 16 ||| 14 ||
| Cast roll temp ° F. |  | 70 |  | 70 ||| 70 ||
| Properties ||||||||||
| Gauge (mil) |  | 8.5 |  | 7.7 ||| 8.1 ||
| Layer thickness (mil) | 2.9 | 2.0 | 3.7 | 3.7 | 4.0 | 2.1 | 0.9 | 5.1 |
| Layer Profile (%) | 34 | 24 | 43 | 48 | 52 | 26 | 11 | 63 |
| Interlayer adhesion ||||||||||
| Peel Strength at 23° C. (lbf) |  | >2.6 |  | >3.1 ||| >3.4 ||
| Failure |  | EVA deformation, EVA delamination ||  | EVA deformation, EVA delamination ||| MAH-m-EVA/E-GMA deformation, & delamination ||
| Peel Strength at 85° C. maximum (lbf) |  | 0.4 |  | 0.2 ||| >1.1 ||
| Peel Strength at 85° C. average (lbf) |  | 0.2 |  | 0.2 ||| — ||
| Failure |  | EVA delamination |  | EVA delamination ||| MAH-m-EVA/E-GMA broke. ||

EVA is an extrudable ethylene vinyl acetate copolymer resin ($I_2$ of about 2.5 g/10 minutes) and a density of 0.94 g/cm³ comprising 15 wt % units derived from vinyl acetate and stabilized with BHT antioxidant.

PE is a LDPE (low density polyethylene) having a 1.15 g/10 min (2.16 kg/190° C.) melt index polyethylene with a density of 0.922 g/cm³.

PP is a polypropylene homopolymer with an 8.0 g/10 min (2.16 kg/230° C.) melt flow rate (MFR).

UV/PE concentrate is an additive polyethylene concentrate comprising about 10-13 wt % UV stabilizers, UV absorber, and antioxidants.

UV/PP concentrate is an additive polypropylene concentrate comprising about 10-13 wt %
UV stabilizers, UV absorber, and antioxidants.

MAH-modified-EVA is BYNEL ® co-extrudable adhesive resin comprising a maleic anhydride-modified ethylene vinyl acetate copolymer. The resin has a density of 0.934 g/cm³ and an MFR (190° C./2.16 kg) of 5.7 g/10 min and a melting point of 92° C. (Density and MFR reported for MAH-modified-EVA).

White PE MB is a white concentrate based on polyethylene (another LDPE) and 50 wt % $TiO_2$.

White PP MB is a white concentrate based on polypropylene (usually having a relatively high MFR) and 50 wt % $TiO_2$.

E-GMA is ethylene glycidyl methacrylate copolymer (melting point of 105° C. and a melt index (190° C./2.16 kg) of 5 g/10 min.

MAH-m-PP is a maleic anhydride grafted polypropylene (1 wt % MAH) with a MFR (190° C./2.16 kg) of 115 g/10 min.

Two and Three-Layer Structures

The individual layers of the multilayer backsheet are separated. A 180° peel test is carried out on an INSTRON® tester (model 5500R) at a speed of 20 inch/min. The peel strength and the failure mode are recorded in the Table. Example 1 and Example 2 (structure illustrated in FIG. 7 and FIG. 6, respectively) show good interlayer adhesion at 23° C. and the top layer of the multilayer backsheet structure deforms during testing. However, when the 180° peel test is conducted at 85° C., the top layer delaminates from the other layer of the backsheet with low peel strength of 0.2 lbf/in. Example 3 (structure illustrated in FIG. 3) shows good interlayer adhesion both at 23° C. and at 85° C. and the top and tie layers deform and/or break during peeling, indicating the strong bonds created by the reaction of maleic anhydride and glycidyl methacrylate.

Although the invention has been described in considerable detail through the preceding description and examples, this detail is for the purpose of illustration and is not to be construed as a limitation on the scope of the invention as it is described in the appended claims.

What is claimed is:

1. A multilayer structure each layer of which having opposing facial surfaces, the structure comprising (A) a top layer comprising a maleic anhydride modified (MAH-m) polyolefin (MAH-m-polyolefin) or a blend of a polyolefin and a MAH-m-polyolefin and having a top facial surface and a bottom facial surface, (B) a first tie layer comprising an amine-functionized polyolefin or a copolymer of an ethylene with a glycidal ester of an unsaturated carboxylic acid and an optional third monomer, the tie layer adhesive and having a top facial surface and a bottom facial surface, the top facial surface in adhering contact with the bottom facial surface of the top layer, and (C) a bottom layer comprising a polyolefin having at least one melting peak greater than 125° C. and having a top facial layer and a bottom facial surface, the top facial surface in adhering contact with the bottom facial surface of the first tie layer.

2. The multilayer structure of claim 1 further comprising a second tie layer having top and bottom facial surfaces, the second tie layer comprising an adhesive different than the adhesive of the first tie layer, the adhesive comprises an amine-functionalized polyolefin or a copolymer of an ethylene with a glycidyl ester of an $\alpha,\beta$-unsaturated acid and an optional third comonomer.

3. A multilayer structure without a tie layer, the top layer comprises two sublayers, each sublayer having opposing facial surfaces, the first or top sublayer comprising (i) an ethylene copolymer, (ii) a MAH-m-ethylene copolymer, (iii) a propylene copolymer, (iv) a MAH-m-propylene copolymer, or (v) a blend of two or more of (i)-(iv), the first or top facial surface of which is in adhering contact with an encapsulant or the back surface of an electronic device (ED), and a second or bottom sublayer comprising an ethylene copolymer or a MAH-m-ethylene copolymer, with the proviso that the top and bottom sublayers are not compositionally the same, the first or top facial surface of which is in adhering contact with the second or bottom surface of the top sublayer.

4. A multilayer structure that does not contain a tie layer, the backsheet comprising a first or top layer that comprises two sublayers, (a) a first or top sublayer comprising (i) EVA, (ii) MAH-m-EVA, (iii) a blend of EVA and polyethylene, (iv) a blend of MAR-m-EVA and polyethylene, (v) a propylene copolymer, or (vi) a MAH-m-propylene copolymer, and (b) a second or bottom sublayer comprising EVA or MAH-m-EVA.

5. An ED module comprising the multilayer structure of claim 3.

6. An electronic device (ED) module comprising a multilayer structure each layer of which having opposing facial surfaces, the structure comprising (A) a top layer comprising a maleic anhydride modified (MAH-m) polyolefin (MAH-m-polyolefin) or a blend of a polyolefin and a MAH-m-polyolefin and having a top facial surface and a bottom facial surface, (B) a first tie layer comprising an amine-functionized polyolefin or a copolymer of an ethylene with a glycidal ester of an unsaturated carboxylic acid and an optional third monomer, the tie layer adhesive and having a top facial surface and a bottom facial surface, the top facial surface in adhering contact with the bottom facial surface of the top layer, and (C) a bottom layer comprising a polyolefin having at least one melting peak greater than 125° C. and having a top facial layer and a bottom facial surface, the top facial surface in adhering contact with the bottom facial surface of the first tie layer, the electronic device is in the form of a photovoltaic cell, a liquid crystal panel, an electro-luminescent device, or a plasma display unit.

7. The ED module of claim 6 in which the electronic device is a photovoltaic cell.

* * * * *